(12) United States Patent
Sun

(10) Patent No.: US 10,681,472 B2
(45) Date of Patent: Jun. 9, 2020

(54) MEMS MICROPHONE AND METHOD OF MANUFACTURING THE SAME

(71) Applicant: DB HITEK CO., LTD., Gangnam-gu Seoul (KR)

(72) Inventor: Jong Won Sun, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/127,693

(22) Filed: Sep. 11, 2018

(65) Prior Publication Data

US 2019/0082269 A1    Mar. 14, 2019

(30) Foreign Application Priority Data

Sep. 11, 2017    (KR) .......................... 10-2017-0115691

(51) Int. Cl.
*H04R 19/04*    (2006.01)
*B81B 3/00*    (2006.01)
(Continued)

(52) U.S. Cl.
CPC ........... *H04R 19/04* (2013.01); *B81B 3/0051* (2013.01); *B81C 1/00039* (2013.01); *H04R 7/18* (2013.01);
(Continued)

(58) Field of Classification Search
CPC .......... H04R 7/18; H04R 7/20; H04R 19/005; H04R 19/016; H04R 19/04; H04R 31/003;
(Continued)

(56) References Cited

U.S. PATENT DOCUMENTS

| 6,535,460 B2 * | 3/2003 | Loeppert ............... B81B 3/0072 367/181 |
| 7,362,873 B2 * | 4/2008 | Pedersen ............... B81B 3/0072 381/113 |

(Continued)

FOREIGN PATENT DOCUMENTS

| KR | 1020080052222 A | 6/2009 |
| KR | 1020100073051 A | 7/2010 |

(Continued)

OTHER PUBLICATIONS

Korean Office Action, Korean Application No. 10-2016-0050894, dated Feb. 22, 2018, 3 pages (7 pages with translation).

(Continued)

*Primary Examiner* — Huyen D Le
(74) *Attorney, Agent, or Firm* — Patterson Thuente Pedersen, P.A.

(57) ABSTRACT

A MEMS microphone includes a substrate having a cavity, a back plate disposed over the substrate, the back plate having a plurality of acoustic holes, a diaphragm interposed between the substrate and the back plate, and being spaced apart from the substrate and the back plate, the diaphragm covering the cavity, forming an air gap between the back plate, and sensing an acoustic pressure to generate a displacement, and a plurality of anchors extending from an end portion of the diaphragm and along a circumference of the diaphragm, each of the anchors having a serpentine shape in a plan view and including a bottom portion making contact with an upper surface of the substrate to support the diaphragm from the substrate. Thus, the MEMS microphone may have adjustable area of the slit.

16 Claims, 8 Drawing Sheets

(51) Int. Cl.
*B81C 1/00* (2006.01)
*H04R 19/00* (2006.01)
*H04R 7/18* (2006.01)
*H04R 31/00* (2006.01)
*H04R 7/04* (2006.01)

(52) U.S. Cl.
CPC ......... *H04R 19/005* (2013.01); *H04R 31/003* (2013.01); *B81B 2201/0257* (2013.01); *B81B 2203/0127* (2013.01); *B81B 2203/0307* (2013.01); *B81C 2201/0109* (2013.01); *B81C 2201/0132* (2013.01); *H04R 7/04* (2013.01); *H04R 31/00* (2013.01); *H04R 2201/003* (2013.01)

(58) Field of Classification Search
CPC ............ H04R 31/006; H04R 2201/003; B81B 2201/0257
USPC ....... 381/113, 116, 174, 175, 190, 191, 369; 367/170, 181; 29/594
See application file for complete search history.

(56) References Cited

U.S. PATENT DOCUMENTS

| | | | |
|---|---|---|---|
| 8,942,394 | B2 | 1/2015 | Conti et al. |
| 2006/0233401 | A1 | 10/2006 | Wang |
| 2011/0227177 | A1* | 9/2011 | Nakatani ................. B81B 3/007 257/416 |
| 2016/0362292 | A1 | 12/2016 | Chang |
| 2017/0212070 | A1 | 7/2017 | Lee et al. |
| 2017/0234821 | A1 | 8/2017 | Lee et al. |
| 2017/0311083 | A1 | 10/2017 | Sun et al. |
| 2017/0311088 | A1 | 10/2017 | Sun et al. |
| 2017/0311089 | A1 | 10/2017 | Sun et al. |
| 2017/0359648 | A1 | 12/2017 | Park et al. |

FOREIGN PATENT DOCUMENTS

| | | |
|---|---|---|
| KR | 101462375 B1 | 11/2014 |
| KR | 101578542 B1 | 12/2015 |

OTHER PUBLICATIONS

Korean Final Office Action, Korean Application No. 10-2016-0050894, dated Jun. 26, 2018, 4 pages (7 pages with translation).
U.S. Appl. No. 15/497,366, filed Apr. 26, 2017, Inventor(s): Sun et al.
U.S. Appl. No. 16/056,840, filed Aug. 7, 2018, Inventor(s): Park et al.
U.S. Appl. No. 16/056,863, filed Aug. 7, 2018, Inventor(s): Sun.
U.S. Appl. No. 16/127,857, filed Sep. 11, 2018, Inventor(s): Sun.
U.S. Appl. No. 16/127,897, filed Sep. 11, 2018, Inventor(s): Kim et al.

* cited by examiner

MEMS MICROPHONE AND METHOD OF MANUFACTURING THE SAME

CROSS-REFERENCE TO RELATED APPLICATION

This application claims priority to Korean Patent Application No. 10-2017-0115691, filed on Sep. 11, 2017, and all the benefits accruing therefrom under 35 U.S.C. § 119, the contents of which are incorporated by reference in their entirety.

TECHNICAL FIELD

The present disclosure relates to MEMS microphones capable of converting an acoustic wave into an electrical signal, and a method of manufacturing such MEMS microphones, and more particularly, to capacitive MEMS microphones being capable of transmitting signal related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

The MEMS microphone may include a bendable diaphragm and a back plate which is facing the diaphragm. The diaphragm can be a membrane structure to generate a displacement due to the acoustic pressure. In particular, when the acoustic pressure is applied to the diaphragm, the diaphragm may be bent upwardly or downwardly due to the acoustic pressure. The displacement of the diaphragm can be sensed through a change of capacitance between the diaphragm and the back plate. As a result, an acoustic wave can be converted into an electrical signal for output.

The characteristics of the MEMS microphone can be determined by measuring various factors such as a frequency response, a pull-in voltage, a total harmonic distortion (THD), sensitivity, etc.

The frequency response may indicate how the sensitivity of the MEMS microphone varies with respect to the frequency. The less sensitivity changes with frequency, the better performance of the MEMS microphone has.

In particular, the performance of a MEMS microphone can be safely secured when the cut-off frequency should be less than about 3 dB. Here, the cut-off frequency of the MEMS microphone corresponds to a difference between the sensitivity at about 1 kHz and the sensitivity at about 100 Hz.

Furthermore, the cut-off frequency characteristic may be improved, as an inlet area where the acoustic pressure moves into becomes large or a pressure where the acoustic pressure moves out from the MEMS microphone becomes higher. However, it may be difficult to enlarge the inlet area for the acoustic pressure because the enlarged outlet area may cause the diaphragm or the back plate to sag down, and the minimum area occupied by other components may be further required.

On the other hand, a total harmonic distortion (THD) may indicate a phenomenon that unnecessary harmonic components are generated in the audio signal and a distortion occurs. The distortion components correspond to component tone originally not included in audio signal input, which may cause reproduction sound quality to be degraded. Therefore, the MEMS microphone may be required to be configured so that the THD does not exceed the proper level. Further, when the flexibility of the diaphragm is low, the THD may become relatively high to deteriorate the quality of the MEMS microphone.

SUMMARY

The example embodiments of the present invention provide a MEMS microphone capable of improving frequency response characteristics and a method of manufacturing the MEMS microphone. The MEMS microphone can include a substrate defining a cavity, a back plate disposed over the substrate, the back plate defining a plurality of acoustic holes, a diaphragm interposed between the substrate and the back plate, and being spaced apart from the substrate and the back plate, the diaphragm covering the cavity, forming an air gap between the back plate. The method can include sensing an acoustic pressure that generates a displacement, wherein a plurality of anchors extend from an end portion of the diaphragm and along a circumference of the diaphragm, each of the anchors presenting a serpentine shape in a plan view and including a bottom portion making contact with an upper surface of the substrate to support the diaphragm from the substrate.

In an example embodiment, the anchors adjacent to each other may define at least slit to provide a passage through which the acoustic pressure moves.

The slit may have a length smaller than each of the anchors, in embodiments.

In an example embodiment, the anchors may be spaced apart from each other to surround the cavity.

In an example embodiment, each of the anchors may be integrally formed with the diaphragm.

In an example embodiment, the diaphragm may include a plurality of vent holes penetrating therethrough, and the vent holes being disposed inside of the anchors toward a center of the diaphragm.

In an example embodiment, the MEMS microphone may further comprise an upper insulation layer disposed on the substrate, the upper insulation layer covering the back plate and holding the back plate to space the back plate from the diaphragm such that the air gap is maintained, and a chamber being provided outside of the anchors, the chamber making contact with the lower surface of the substrate to support the upper insulation layer and to space the upper insulation layer from the diaphragm.

In embodiments, the chamber may be positioned to be spaced apart from the diaphragm, and the chamber may have a ring shape to surround the diaphragm.

Further, the chamber may be integrally formed with the upper insulation layer.

According to example embodiments, a MEMS microphone includes a substrate being divided into a vibration area, a supporting area surrounding the vibration area and the peripheral area surrounding the supporting area, the substrate defining a cavity formed in the vibration, a diaphragm disposed over the substrate to cover the cavity, the diaphragm being spaced apart from the substrate and being configured to generate a displacement in response to an applied acoustic pressure, a back plate disposed over the diaphragm and in the vibration area, the back plate being spaced apart from the diaphragm to form an air gap between the diaphragm and a plurality of anchors disposed in the supporting area, the anchors extending from an end portion of the diaphragm toward the substrate, and along a circumference of the diaphragm to support the diaphragm from the substrate, each of the anchors presenting a serpentine shape in a plan view.

In an example embodiment, the anchors adjacent to each other may define at least slit to provide a passage through which the acoustic pressure moves.

In an example embodiment, the slit may be arranged amongst a plurality of slits, and a total area of slits may decrease as a number of the slits decreases, such that the total area of slits is proportional to the number of slits in the plurality.

In an example embodiment, the slit may have a length smaller than each of the anchors.

In addition or alternatively, each of the anchors may have an area larger than that of the slit, in embodiments.

In addition or alternatively, the anchors may be spaced apart from each other to surround the cavity, in embodiments.

In an example embodiment, the MEMS microphone may further include an upper insulation layer covering the back plate and holding the back plate to space the back plate from the diaphragm such that the air gap is maintained, and a chamber disposed in the supporting area and extending from an end portion of the upper insulation layer toward the substrate to support the upper insulation layer, the chamber spacing the upper insulation layer from the diaphragm.

According to example embodiments of manufacturing a MEMS microphone, a lower insulation layer is formed on a substrate being divided into a vibration area, and then a supporting area surrounding the vibration area and a peripheral area surrounding the supporting area, a diaphragm and a plurality of anchors for supporting the diaphragm are formed. After forming a sacrificial layer on the lower insulation layer to cover the diaphragm and the anchors, a back plate is formed on the sacrificial layer and in the vibration area to face the diaphragm. The back plate is patterned to form a plurality of acoustic holes which penetrates through the back plate, and then the substrate is patterned to form a cavity in the vibration area to partially expose the lower insulation layer. Then, an etching process is performed using the cavity and the acoustic holes to remove portions of the sacrificial layer and the lower insulation layer, located at positions corresponding the vibration area and the supporting area, wherein forming the diaphragm and the anchors includes forming the anchors extending from an end portion of the diaphragm and along a circumference of the diaphragm, each of the anchors presenting a serpentine shape in a plan view.

In an example embodiment, forming the diaphragm and the anchors may include patterning the lower insulation layer in the supporting area to form anchor channels for forming the anchors, forming a silicon layer on the lower insulation layer defining the anchor channels, and patterning the silicon layer to form a diaphragm and the anchors.

Here, the anchor channels may be formed to surround the vibration area, and each of the anchor channels has a serpentine shape in a plan view.

In an example embodiment, the method may further include, prior to forming the acoustic holes, an upper insulation layer may be formed on the sacrificial layer for holding the back plate to be spaced apart from the diaphragm, and a chamber for supporting the upper insulation layer, wherein forming the vent holes may include patterning the back plate and the upper insulation layer such that the vent holes penetrate through the back plate and the upper insulation layer.

According to some embodiments of the present invention as described above, the MEMS microphone has the anchors extending along the circumference of the diaphragm, so that the area of the slits formed between the anchors may be adjusted. Particularly, since the slits serve as the outlets for the acoustic pressure, it may be possible to reduce the outlet area by adjusting the total outlet area of the slits of the MEMS microphone. As a result, the pressure at which the acoustic pressure is discharged out increases, compared to the prior one, so that the cut-off frequency characteristics of the MEMS microphone may be remarkably improved. As a result, the frequency response characteristics of the MEMS microphone can be improved.

Furthermore, since each of the anchors is provided with a serpentine structure, the flexibility of the diaphragm may be remarkably improved, while maintaining the rigidity of the diaphragm. As a result, the total harmonic distortion of the MEMS microphone may be adjusted so that it does not exceed an appropriate level, and the quality of the MEMS microphone may be improved. In addition, since the anchors can function to restrict the movement of the etchant in the manufacturing process of the MEMS microphone, the process margin may be secured compared to the prior one and the lower insulation layer may be prevented from remaining on the inner periphery of each of the anchors. As a result, the MEMS microphone may prevent the buckling phenomenon of the diaphragm which might occur due to the residual insulation layer and make the sound wave smoother.

BRIEF DESCRIPTION OF THE DRAWINGS

Example embodiments can be understood in more detail from the following description taken in conjunction with the accompanying drawings, in which.

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
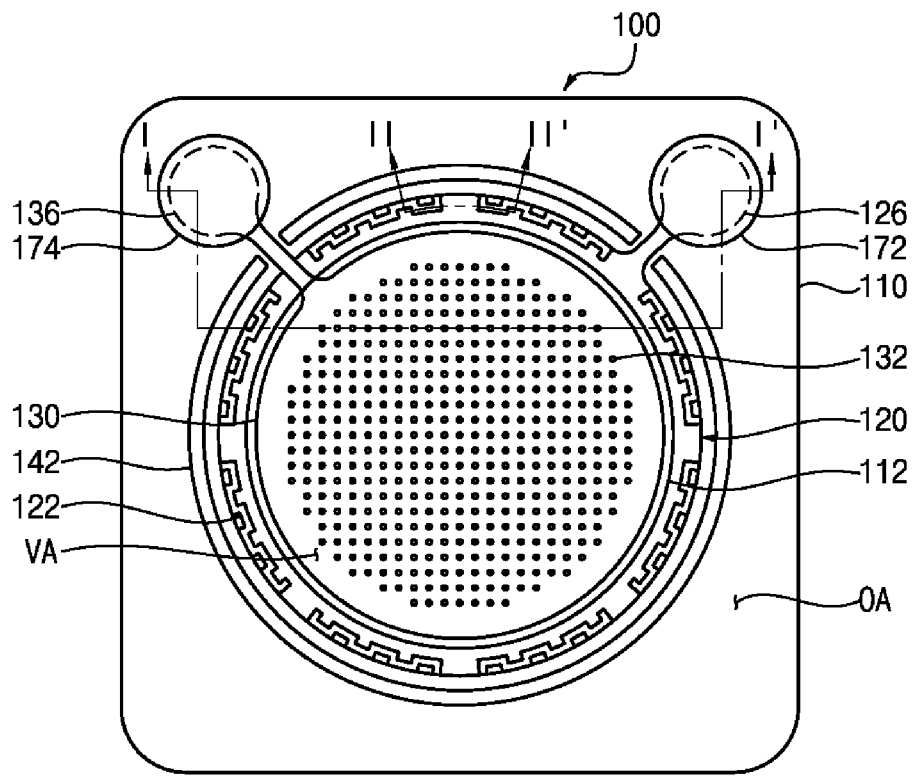
FIG. 1 is a plan view illustrating a MEMS microphone in accordance with an example embodiment of the present invention.
Figure 2:
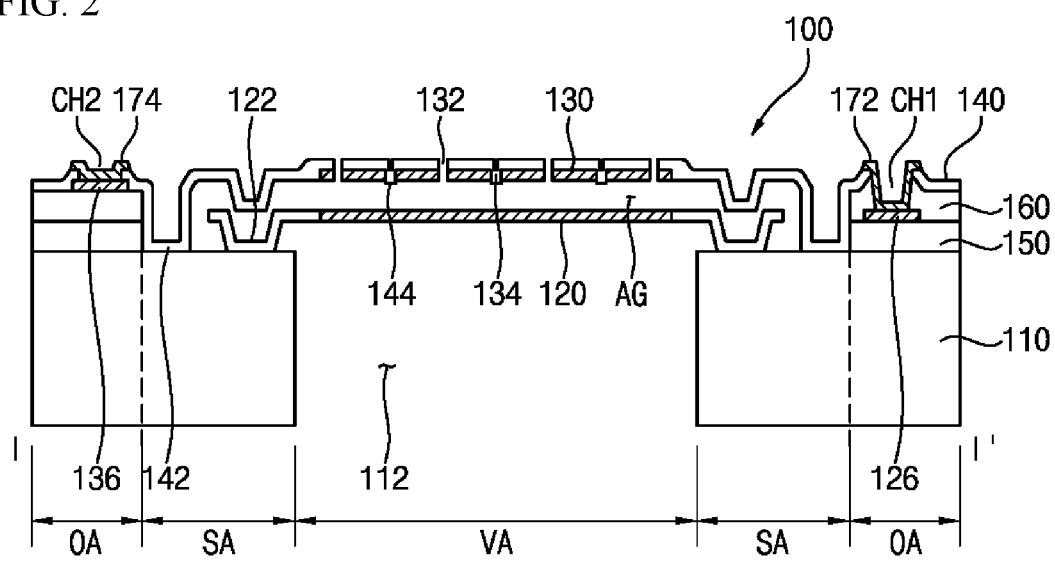
FIG. 2 is a cross sectional view taken along a line I-I' of FIG. 1.
Figure 3:
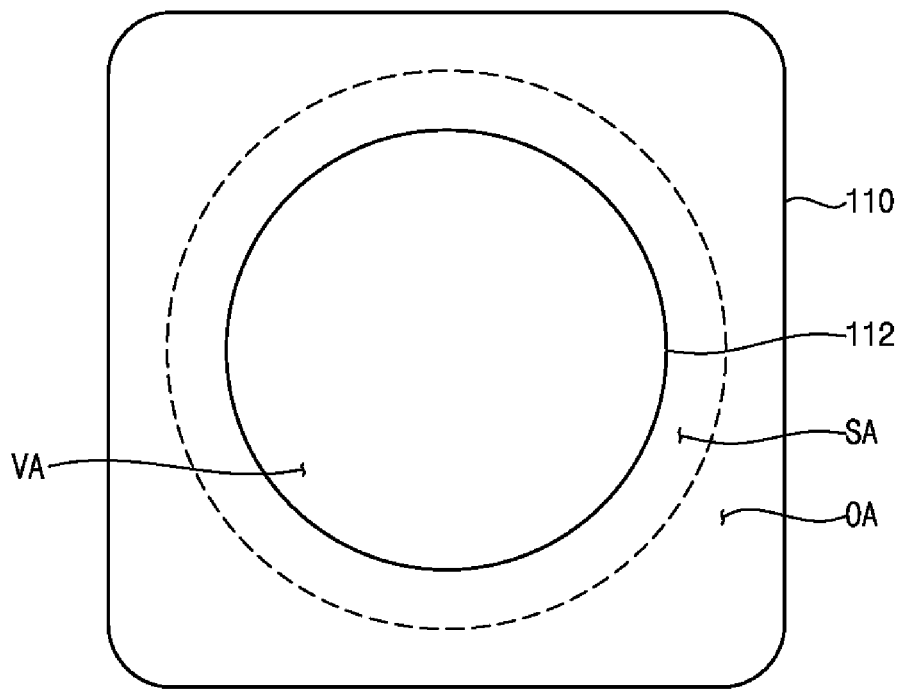
FIG. 3 is a plan view illustrating the substrate shown in FIG. 2.
Figure 4:
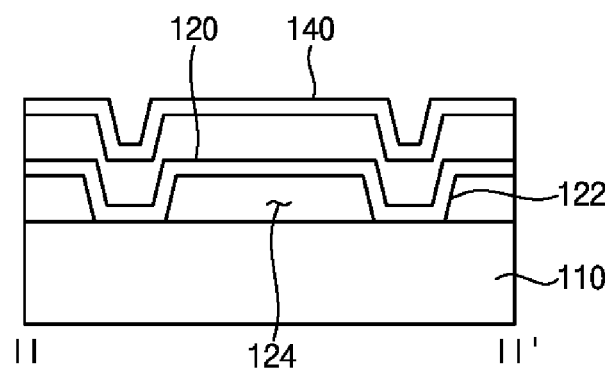
FIG. 4 is a cross sectional view taken along a line of FIG. 1.

FIG. 1 is a plan view illustrating a MEMS microphone in accordance with an example embodiment of the present invention. FIG. 2 is a cross sectional view taken along a line I-I' of FIG. 1. FIG. 3 is a plan view illustrating the substrate shown in FIG. 2. FIG. 4 is a cross sectional view taken along a line II-II' of FIG. 1.

Referring to FIGS. 1 to 3, a MEMS microphone 100 in accordance with an example embodiment of the present invention is capable of creating a displacement in response to an applied acoustic pressure to convert an acoustic wave into an electrical signal and output the electrical signal. The MEMS microphone 100 includes a substrate 110, a diaphragm 120, a plurality of anchors 122, and a back plate 130.

As shown in FIG. 3, the substrate 110 is divided into a vibration area VA, a supporting area SA surrounding the vibration area VA, and a peripheral area OA surrounding the supporting area SA. In the vibration area VA of the substrate 110, a cavity 112 is formed to provide a space in which the diaphragm 120 is bendable due to the acoustic pressure.

In an example embodiment, the cavity 112 may have a cylindrical shape. Further, the cavity 112 may be formed in the vibration area VA to have a shape and a size corresponding to those of the vibration area VA.

The diaphragm 120 may be disposed over the substrate 110. The diaphragm may generate a displacement which may occur due to the acoustic pressure. The diaphragm 120 may have a membrane structure. The diaphragm 120 may cover the cavity 112. The diaphragm 120 may have a lower surface to be exposed through the cavity 112. The diaphragm 120 is bendable in response to the applied acoustic pressure, and the diaphragm 120 is spaced apart from the substrate 110.

As shown in FIG. 2, the diaphragm 120 may have a doped portion which is doped with impurities through an ion implantation process. The doped portion may be positioned to correspond to the back plate 130.

In an example embodiment, the diaphragm 120 may have a shape of a circular disc, as shown in FIG. 1.

Referring to FIGS. 1, 2 and 4, the anchors 122 are arranged along a circumference of the diaphragm 120. The anchors 122 extend from an end portion of the diaphragm 120 toward the substrate 110 to space the diaphragm 120 from the substrate 110.

As shown in FIG. 1, each of the anchors 122 may extend from a periphery of the diaphragm 120. The anchors 122 extend from an end portion of the diaphragm 120 toward the substrate 110 to space the diaphragm 120 from the substrate 110. The anchors 122 may be spaced apart from one another along the circumference of the diaphragm 120, and may be disposed to surround the cavity 112, as shown in FIG. 1.

In an example embodiment of the present invention, the anchor 122 may be integrally formed with the diaphragm 120, as shown in FIG. 2. The anchor 122 may have a bottom portion to be coupled to the substrate 110.

Further, in an example embodiment, each of the anchors 122 may have an arc shape.

Particularly, as shown in FIG. 1, each of the anchors 122 may have a serpentine shape. That is, each of the anchors 122 may extend in a serpentine shape along the circumference of the diaphragm 120, when viewed on a plan. Thus, since the anchors 122 are provided in the serpentine structure, a flexibility of the diaphragm 120 can be remarkably improved as compared with the prior one. As a result, the total harmonic distortion (THD) of the MEMS microphone 100 can be adjusted so as not to exceed an appropriate level, and a quality of the MEMS microphone 100 may be improved.

Also, as shown in FIG. 4, slits 124 may be formed between two adjacent anchors of the anchors 122. The slits 124 may be provided as passages through which an acoustic pressure moves. Each of the slits 124 may be formed to have a length smaller than the length of each of the anchors 122, as shown in FIG. 1. That is, each of the anchors 122 may have an area larger than the area of the slits 124. Particularly, a total area of the slits 124 formed between the anchors 122 may be determined by the number of the slits 124, and, thus the total area may be reduced as the number of the slits 124 is smaller. Here, the number of the slits 124 may be determined according to the length and the number of the anchors 122.

Particularly, since each of the slits 124 is provided as the passage through which the acoustic pressure is discharged, an outlet area where the acoustic pressure move through the slits 124 may be adjusted by adjusting the total area of the slits 124. The outlet area may affect cut-off frequency characteristics of the MEMS microphone 100. Accordingly, the MEMS microphone 100 may reduce the outlet area of the acoustic pressure by adjusting the total area of the slits 124. As a result, the MEMS microphone 100 has improved frequency response characteristics.

The back plate 130 may be disposed over the diaphragm 120. The back plate 130 may be disposed in the vibration area VA to face the diaphragm 120. For example, the back plate 130 may have a circular shape, as shown in FIG. 1. The back plate 130 may have a doped portion which is formed by doping impurities through an ion implantation process.

In an example embodiment, the MEMS microphone 100 may further include an upper insulation layer 140 and a chamber 142 for supporting the back plate 130 from the substrate 110.

In particular, the upper insulation layer 140 is positioned over the substrate 110 over which the back plate 130 is positioned. The upper insulation layer 140 may cover the back plate 130 to hold the back plate 130. Thus, the upper insulation layer 140 may space the back plate 130 from the diaphragm 120.

As shown in FIG. 2, the back plate 130 and the upper insulation layer 140 are spaced apart from the diaphragm 120 to make the diaphragm 120 freely bendable in response to the applied acoustic pressure. Further, an air gap AG is formed between the diaphragm 120 and the back plate 130.

A plurality of acoustic holes 132 may be formed through the back plate 130 such that the acoustic wave may flow through the acoustic holes 132. The acoustic holes 132 may be formed through the upper insulation layer 140 and the back plate 130 to communicate with the air gap AG.

Further, the back plate 130 may include a plurality of dimple holes 134. Further, a plurality of dimples 144 may be positioned in the dimple holes 134. The dimple holes 134 may be formed through the back plate 130. The dimples 144 may be positioned to correspond to positions at which the dimple holes 134 are formed.

The dimples 144 may prevent the diaphragm 120 from being coupled to a lower face of the back plate 130. That is, when the acoustic pressure reaches to the diaphragm 120, the diaphragm 120 can be bent in a semicircular shape toward the back plate 130, and then can return to its initial position. A bending degree of the diaphragm 120 may vary depending on a magnitude of the acoustic pressure and may be increased to such an extent that an upper surface of the diaphragm 120 makes contact with the lower surface of the back plate 130. When the diaphragm 120 is bent so much as to contact the back plate 130, the diaphragm 120 may attach to the back plate 130 and may not return to the initial position.

According to example embodiments, the dimples 144 may protrude from the lower surface of the back plate 130 toward the diaphragm 120. Even when the diaphragm 164 is severely bent so much that the diaphragm 120 contacts the back plate 130, the dimples 144 may make the diaphragm 120 and the back plate 130 to be separated from each other so that the diaphragm 120 can return to the initial position.

In the meantime, the chamber 142 may be positioned across a boundary between the peripheral area OA and the supporting area SA. The chamber 142 may support the upper insulation layer 140 to space the upper insulation layer 140 and the back plate 130 from the diaphragm 120. The chamber 142 may have a ring shape to surround the diaphragm 120, as shown in FIG. 1. The chamber 142 may be spaced apart from the diaphragm 120 and the anchors 122.

The chamber 142 may extend from the upper insulation layer 140 toward the substrate 110 to be coupled to the upper surface of the substrate 110, as shown in FIG. 2. A vertical section of the chamber 142 may have a U-shape and may be integrally formed with the upper insulation layer 140.

The chamber 142 may be spaced apart from the diaphragm 120 and positioned outside the anchor 130, as shown in FIG. 2. As depicted in FIG. 1, the chamber 142 may have a ring shape and may be disposed to surround the diaphragm 120.

In an example embodiment, the MEMS microphone 100 may further include a lower insulation layer pattern 150, a diaphragm pad 126, a sacrificial layer pattern 160, a back plate pad 136, a first pad electrode 172 and a second pad electrode 174.

In particular, the lower insulation layer pattern 150 may be disposed on the upper surface of the substrate 110 and under the upper insulation layer 140.

The diaphragm pad 126 may be formed on an upper surface of the lower insulation layer pattern 150. The diaphragm pad 126 may be located in the peripheral region OA. The diaphragm pad 126 may be electrically connected to the diaphragm 120 and may be doped with impurities. Though not shown in detail in figures, a connection portion may be doped with impurities to electrically connect the doped portion of the diaphragm 120 to the diaphragm pad 126.

The sacrificial layer pattern 160 may be formed on the lower insulation layer pattern 150 on which the diaphragm pad 126 is formed, and may be positioned under the upper insulation layer 140. As shown in FIG. 2, the lower insulation layer pattern 150 and the sacrificial layer pattern 160 are located in the peripheral region OA, and are disposed outside from the chamber 142. Further, the lower insulation layer pattern 150 and the sacrificial layer pattern 160 may be formed using a material different from that of the upper insulation layer 140.

The back plate pad 136 may be formed on an upper face of the sacrificial layer pattern 160. The back plate pad 136 may be located in the peripheral region OA. The back plate pad 136 may be electrically connected to the back plate 130 and may be doped with impurities by in ion implantation process. Though not shown in detail in figures, a connection portion may be doped with impurities to connect the back plate 130 to the back plate pad 136.

The first and second pad electrodes 172 and 174 may be disposed on the upper insulation layer 140 and in the peripheral area OA. The first pad electrode 172 is located on the diaphragm pad 126 to make contact with the diaphragm pad 126. On other hands, the second pad electrode 174 is located on the back plate pad 136 to make contact with the back plate pad 136. As shown in FIG. 2, a first contact hole CH1 is formed by penetrating through the upper insulation layer 140 and the sacrificial layer pattern 160 to expose the diaphragm pad 126, and the first pad electrode 172 makes contact with the diaphragm pad 126 exposed by the first contact hole CH1. Further, a second contact hole CH2 is formed by penetrating through the upper insulation layer 140 to expose the back plate pad 136, and the second pad electrode 174 is formed in the second contact hole CH2 to make contact with the back plate pad 136 exposed by the second contact hole CH2.

As described above, the MEMS microphone 100 according to example embodiments of the present invention includes anchors 122 extending along the circumference of the diaphragm 120 to adjust the area of the slits 124. Particularly, since the slits 124 serve as the passages for the acoustic pressure to move out, the MEMS microphone 100 may adjust the total area of the slits 124 such that the outlet area may be decreased. As a result, the pressure where the acoustic pressure flow out through the slits 124 may increase, compared to the prior one, such that the MEMS microphone 100 may have improved the cut-off frequency characteristics remarkably. As a result, the frequency response characteristic of the MEMS microphone 100 is improved and the performance of the MEMS microphone 100 can be improved.

In addition, since each of the anchors 122 is provided in the serpentine structure, the flexibility of the diaphragm 120 can be remarkably improved while maintaining the rigidity of the diaphragm 120 as compared with the conventional one. As a result, the total harmonic distortion of the MEMS microphone 100 may be adjusted so as not to exceed an appropriate level, and the quality of the MEMS microphone may be improved. Further, since the anchors 122 may function to define the moving region of the etchant in the manufacturing process of the MEMS microphone 100, the process margin may be secured as compared with the conventional one, and the lower insulation layer pattern 150 may be prevented from remaining on the inner periphery of the anchors 122. As a result, the MEMS microphone 100 may prevent buckling phenomenon of the diaphragm 120 which might occur due to the residual insulation layer, and smooth movement of the acoustic waves may be achieved.

Hereinafter, a method of manufacturing a MEMS microphone will be described in detail with reference to the drawings.

Figure 5:
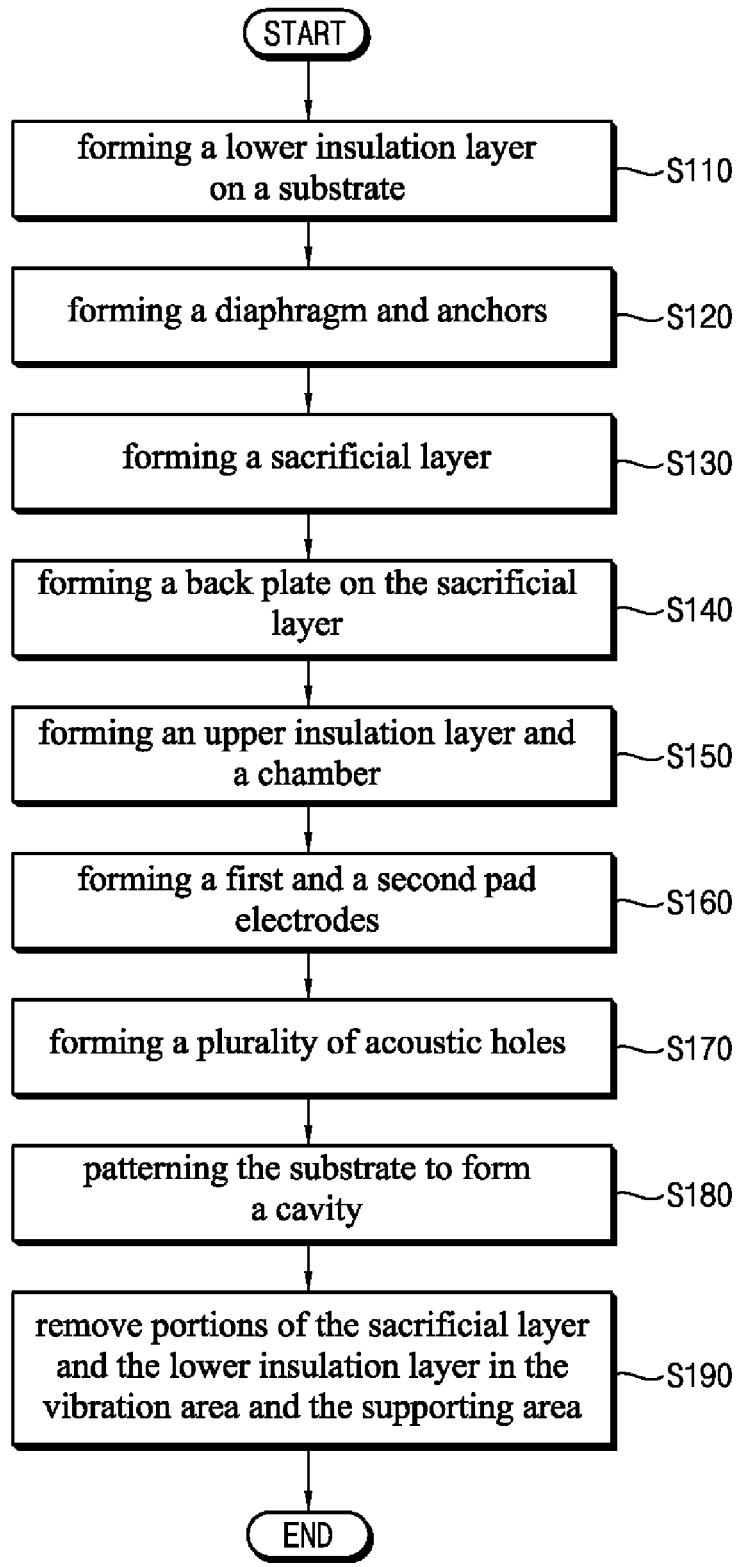
FIG. 5 is a flow chart illustrating a method of manufacturing a MEMS microphone in accordance with an example embodiment of the present invention.

FIG. 5 is a flow chart illustrating a method of manufacturing a MEMS microphone in accordance with an example embodiment of the present invention. FIGS. 6 and 8 to 17 are cross sectional views illustrating a method of manufacturing a MEMS microphone in accordance with an example embodiment of the present invention. Here, FIG. 7 is a plan view illustrating the lower insulation layer pattern in FIG. 6.

Referring to FIGS. 5 to 9, according to example embodiments of a method for manufacturing a MEMS microphone, a lower insulation layer 150 is formed on a substrate (step S110).

Then, a diaphragm 120 and a plurality of anchors 122 are formed on the lower insulation layer 150 (step S120).

The step S120 of forming the diaphragm 120 and the anchors 122 will be explained in detail.

Figure 6:
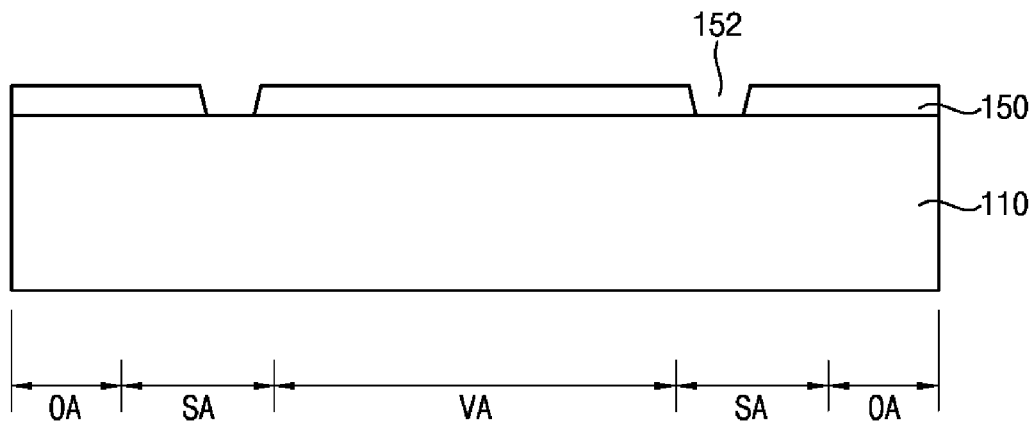
FIGS. 6 and 8 to 17 are cross sectional views illustrating a method of manufacturing a MEMS microphone in accordance with an example embodiment of the present invention.
Figure 7:
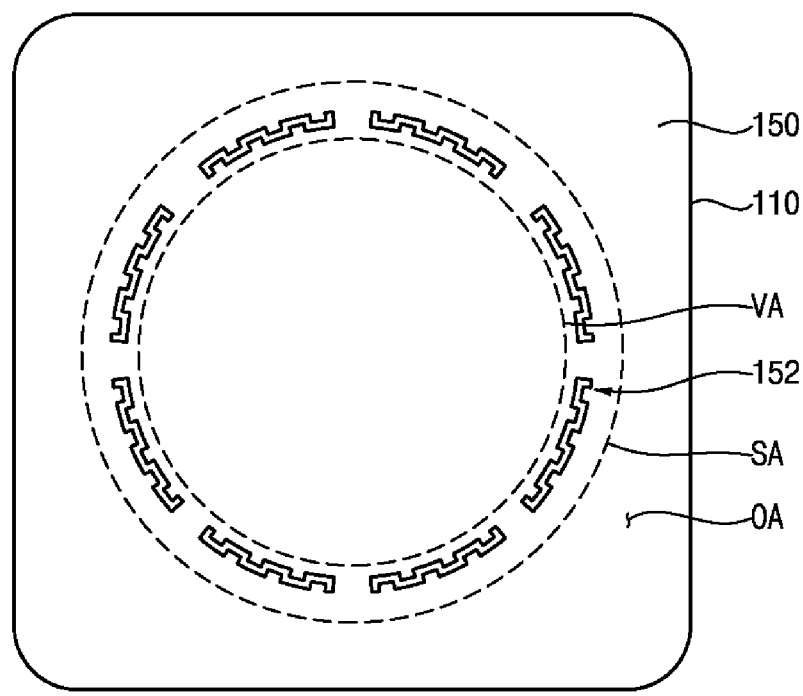
FIG. 7 is a plan view illustrating a lower insulation layer pattern in FIG. 6.

As shown in FIG. 6, the lower insulation layer 150 is patterned to form a plurality of anchor channels 152 for forming the anchors 122. The substrate 110 is partially exposed through the anchor channels 152. As depicted in FIG. 7, the anchor channels 152 may be formed to surround the vibration area VA. Each of the anchor channels 152 may be formed in a serpentine shape. Each of the anchor channels 152 may be arranged along a circumference of the vibration area VA.

Figure 8:
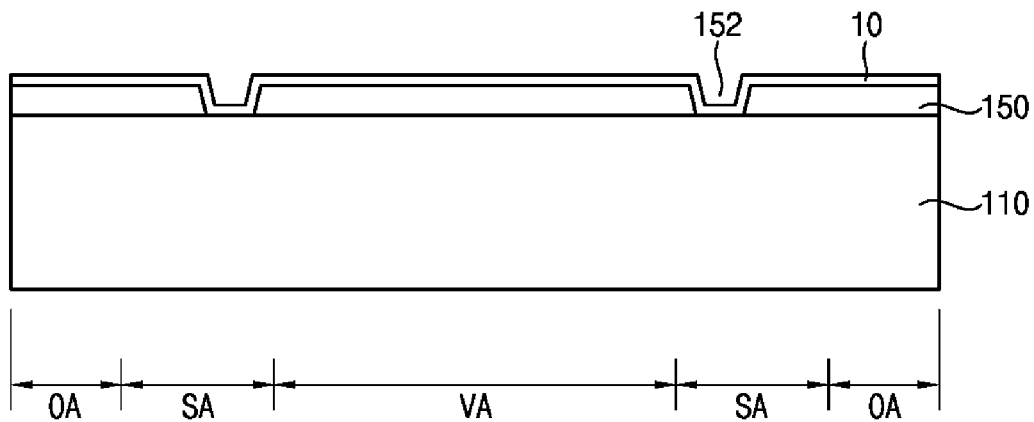
Figure 9:
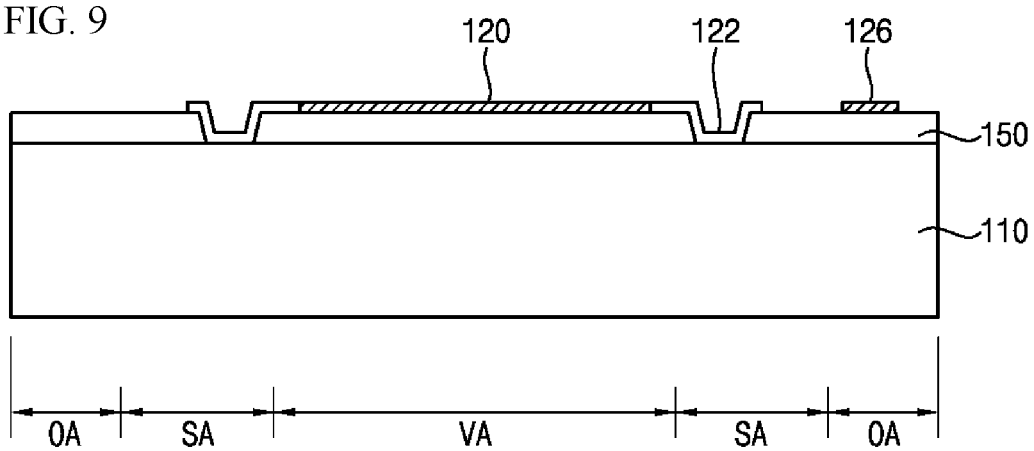

Referring to FIG. 8, a first silicon layer 10 is formed on the lower insulation layer 150. In an example embodiment, the first silicon layer 10 may be formed using polysilicon.

Impurities may be doped into both a portion of the first silicon layer 10 positioned in the vibration region VA and a portion of the first silicon layer 10 to be subsequently transformed into a diaphragm pad 126 through an ion implantation process.

Next, the first silicon layer 10 is patterned to form a diaphragm 120, the anchors 122, and a diaphragm pad 126 is formed in the peripheral area OA. The anchor 122 may be formed in a serpentine shape to correspond to those of the anchor channels 152, respectively.

Figure 10:
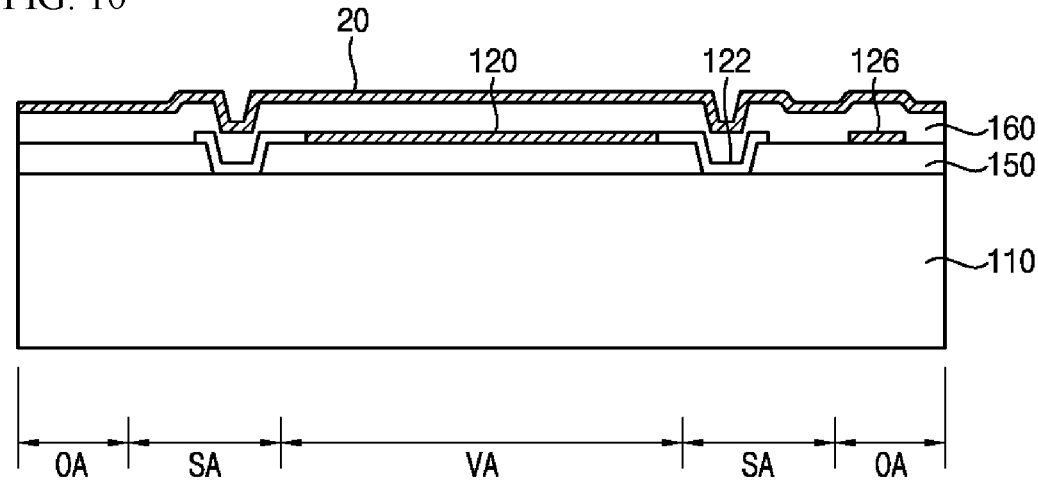

Referring to FIGS. 5 and 10, a sacrificial layer 160 is formed on the lower insulation layer 150 to cover the diaphragm 120 (step S130).

Figure 11:
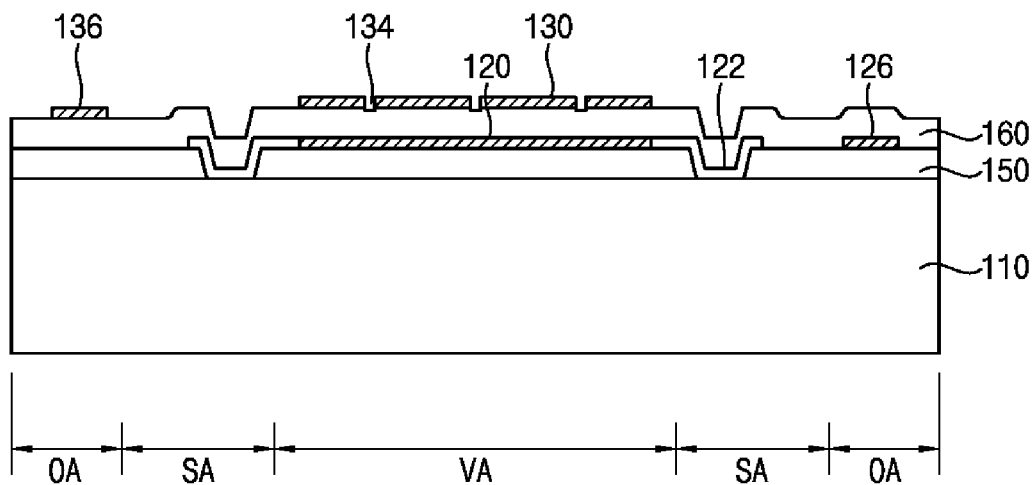

Referring to FIGS. 5 and 11, a back plate 130 is formed on the sacrificial layer 160 (step S140).

The step S140 of forming the back plate 130 will be explained in detail.

In particular, after a second polysilicon layer 20 is formed on an upper surface of the sacrificial layer 160, impurities are doped with the second silicon layer 20 by an ion implantation process. For example, the second silicon layer 20 may be formed using polysilicon.

Next, as shown in FIG. 11, the second silicon layer 20 is patterned to form the back plate 130. Further, when forming the back plate 130, dimple holes 134 for forming dimples 154 (see FIG. 2) may be further formed, whereas acoustic holes 132 (see FIG. 2) may not be formed. Further, a portion of the sacrificial layer 160 corresponding to the dimple holes 134 may be etched to make the dimples 144 (see FIG. 2) to protrude downwardly from a lower surface of the back plate 130.

Figure 12:
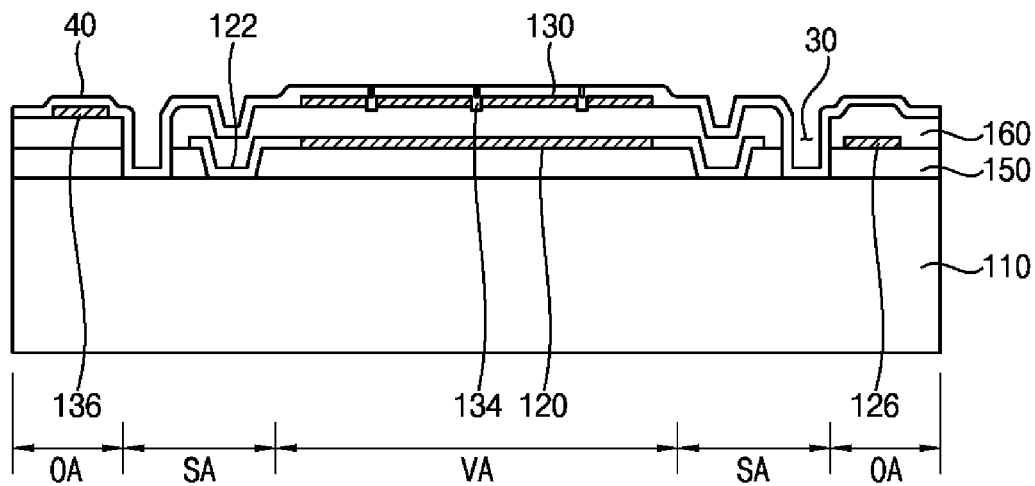
Figure 13:
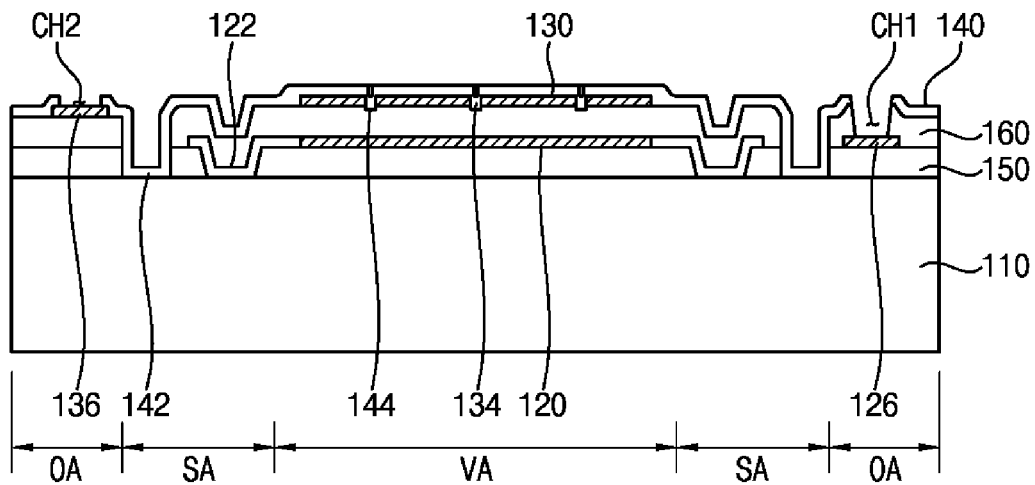

Referring to FIGS. 5, 12 and 13, an upper insulation layer 140 and a chamber 142 are formed on the sacrificial layer 160 on which the back plate 130 is formed (step S150).

The step S150 of forming the upper insulation layer 140 and the chamber 142 will be explained in detail.

As shown in FIG. 12, the sacrificial layer 160 and the lower insulation layer 150 are patterned to form a chamber channel 30 in the supporting area SA for forming the chamber 142. A portion of the substrate 110 may be exposed through the chamber channel 30. The chamber channel 30 may be formed in a ring shape to surround the diaphragm 120.

Next, an insulation layer 40 is formed on the sacrificial layer 160 having the chamber channel 30. Then, as shown in FIG. 13, the insulation layer 40 is patterned to form an upper insulation layer 140 and the chamber 142. Further, the dimples 144 may be further formed in the dimple holes 134 and a second contact hole CH2 is formed in the peripheral area OA to expose the back plate pad 136. Furthermore, both a portion of the insulation layer 40 and a portion of the sacrificial layer 160, positioned over the diaphragm pad 126, are removed to form a first contact hole CH1.

In an example embodiment, the insulation layer 40 may be formed using a material different from those of the lower insulation layer 150 and the sacrificial layer 160. For example, the insulation layer 40 is formed using silicon nitride or silicon oxynitride, whereas the lower insulation layer 150 and the sacrificial layer 160 are formed using silicon oxide.

Figure 14:
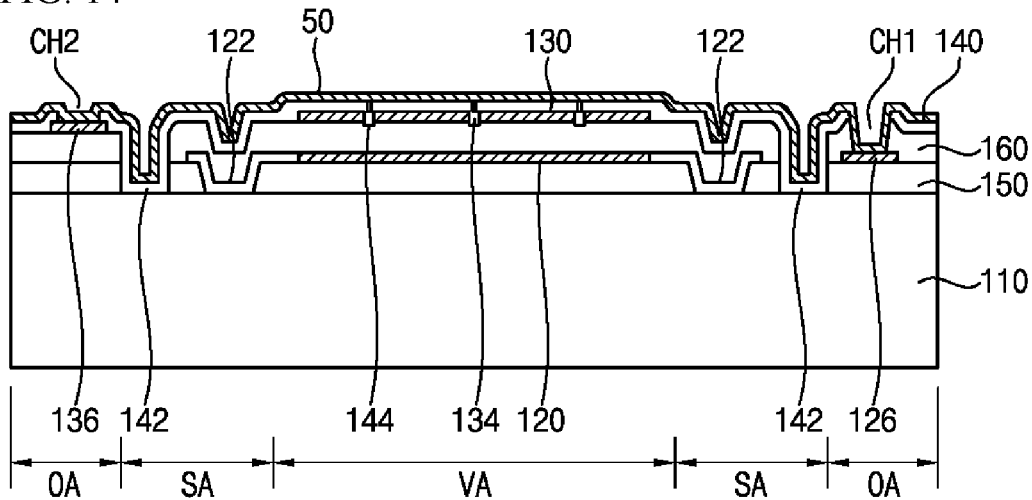
Figure 15:
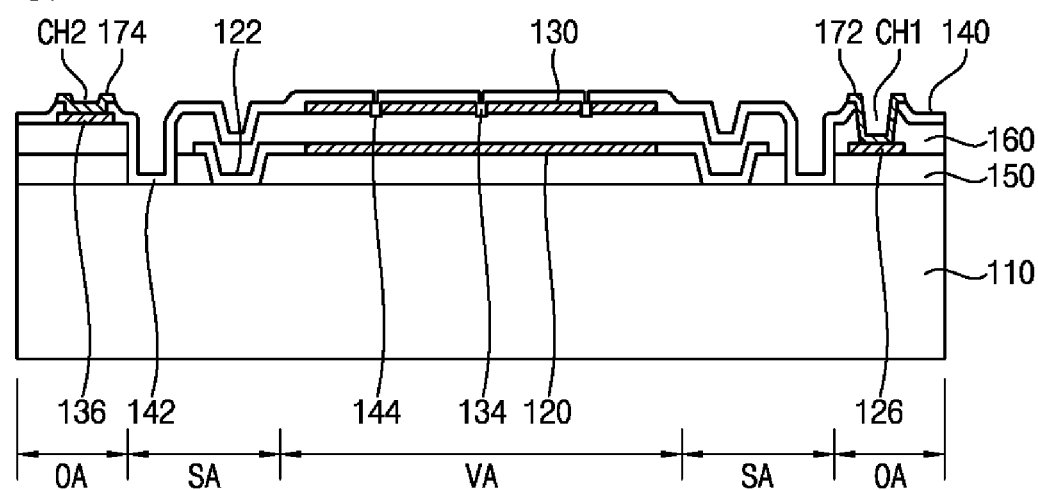

Referring to FIGS. 5, 14 and 15, after forming the first and the second contact holes CH1 and CH2, a first pad electrode 172 and a second pad electrode 174 may be formed (step S160).

In particular, a thin film 50 is formed on the upper insulation layer 140 through which the first and the second contact holes CH1 and CH2 are formed, as shown in FIG. 14. In an example embodiment, the thin film 50 may be formed using a conductive metal such as aluminum.

Next, the thin film 50 is patterned to form a first pad electrode 172 and a second pad electrode 174, as shown in FIG. 15.

Figure 16:
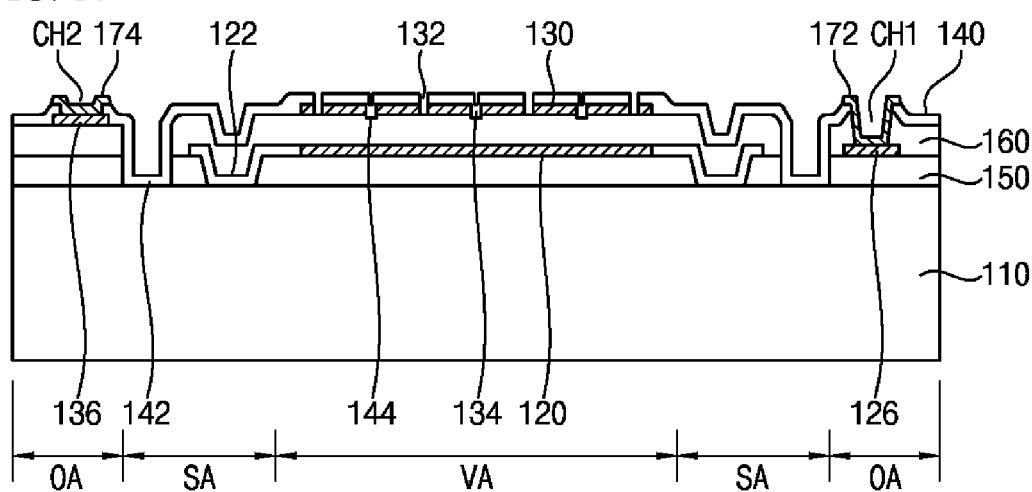

Referring to FIGS. 5 and 16, the upper insulation layer 140 and the back plate 130 are patterned to form acoustic holes 132 in the vibration area VA (step S170).

Figure 17:
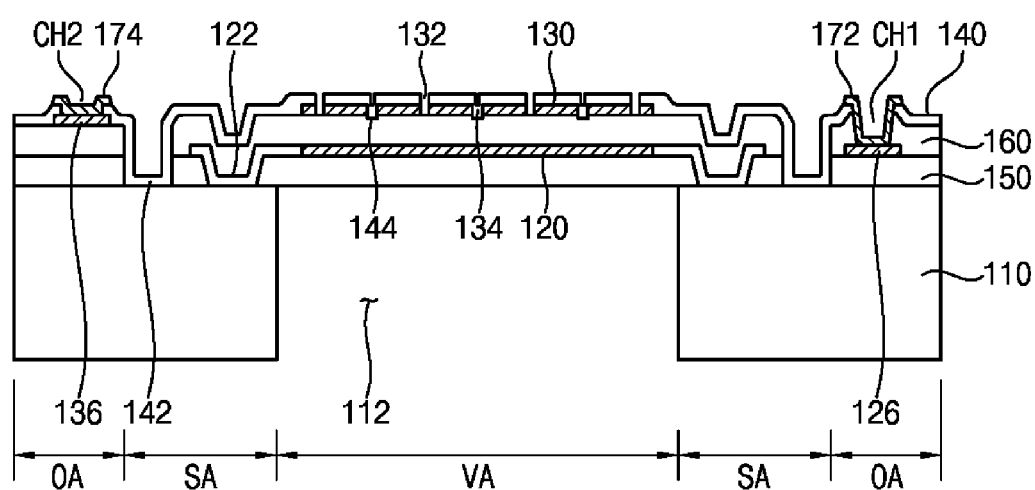

Referring to FIGS. 2, 5, and 17, after forming the acoustic holes 132, the substrate 110 is patterned to form a cavity 112 in the vibration area VA (step S180). Thus, a portion of the lower insulation layer 150 is exposed through the cavity 112.

Next, portions of the sacrificial layer 160 and the lower insulation layer 150, corresponding to the vibration area VA and the supporting area SA, are removed through an etching process using the cavity 112 and the acoustic holes 132 (Step S230). Thus, the diaphragm 120 is exposed through the cavity 112, and an air gap AG is formed. Further, portions of the lower insulation layer 150, which are located between the anchors 122, are removed to form a plurality of slits 124 (see FIG. 4). As a result, the MEMS microphone 100 is manufactured as shown in FIG. The cavities 112 and the acoustic holes 132 may be provided as passages for removing the portions of the lower insulation layer 150 and the sacrificial layer 160.

Particularly, in step S230 of removing the sacrificial layer 160 and the lower insulating layer 150 from the vibration area VA and the supporting area SA, the anchors 122 and the chamber 142 may serve as a barrier for preventing the etchant to flow toward the peripheral area OA. Accordingly, an etching amount of the sacrificial layer 160 and the lower insulation layer 150 can be easily controlled, and the etchant may be prevented from remaining inside the anchors 12.

In an example embodiment of the present invention, HF vapor may be used as the etchant for removing the sacrificial layer 160 and the lower insulating layer 150.

As described above, according to some example embodiment of manufacturing the MEMS microphone the anchors 122 are formed to extend along the circumference of the diaphragm 120 without any additional process, and each of the anchors 122 may be formed into the serpentine structure. Accordingly, the MEMS microphone 100 may be manufactured to have improved frequency response characteristics and total harmonic distortion characteristics without increasing process time and manufacturing cost. In addition, since the process margin can be safely secured as compared with the prior one, it is possible to prevent the lower insulation layer 150 from remaining on the inner periphery of the anchors 122. As a result, the MEMS microphone 100 can prevent buckling phenomenon of the diaphragm 120 which might occur due to the residual insulation layer, and smooth movement of acoustic waves can be achieved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A MEMS microphone comprising:
    a substrate defining a cavity;
    a back plate disposed over the substrate, the back plate defining a plurality of acoustic holes;
    a diaphragm interposed between the substrate and the back plate, the diaphragm spaced apart from the substrate and the back plate, the diaphragm covering the cavity to form an air gap between the back plate and the diaphragm, and configured to sense an acoustic pressure to generate a displacement of the diaphragm; and
    a plurality of anchors extending from an end portion of the diaphragm, the plurality of anchors being arranged along a circumference of the diaphragm and spaced apart from one another along the circumference of the diaphragm, each of the anchors extending along the circumference of the diaphragm, presenting a serpentine shape in a plan view and including a bottom portion making contact with an upper surface of the substrate to support the diaphragm from the substrate.

2. The MEMS microphone of claim 1, wherein the anchors adjacent to each other define a slit to provide a passage through which acoustic pressure can pass.

3. The MEMS microphone of claim 2, wherein the slit has a length smaller than each of the plurality of anchors.

4. The MEMS microphone of claim 1, wherein the plurality of anchors are spaced apart from each other to surround the cavity.

5. The MEMS microphone of claim 1, wherein each of the plurality of anchors are integrally formed with the diaphragm.

6. The MEMS microphone of claim 1, wherein the diaphragm defines a plurality of vent holes penetrating therethrough, and the vent holes are disposed closer to a center of the diaphragm than the anchors are.

7. The MEMS microphone of claim 1, further comprising:
    an upper insulation layer disposed on the substrate, the upper insulation layer covering the back plate and holding the back plate to space the back plate from the diaphragm such that the air gap is maintained; and
    a chamber provided outside of the anchors, the chamber making contact with the lower surface of the substrate to support the upper insulation layer and to space the upper insulation layer from the diaphragm.

8. The MEMS microphone of claim 7, wherein the chamber is spaced apart from the diaphragm, the chamber defining a ring shape to surround the diaphragm.

9. The MEMS microphone of claim 7, wherein the chamber is integrally formed with the upper insulation layer.

10. A MEMS microphone comprising:
- a substrate being divided into a vibration area, a supporting area surrounding the vibration area, and the peripheral area surrounding the supporting area, the substrate defining a cavity formed in the vibration area;
- a diaphragm disposed over the substrate to cover the cavity, the diaphragm being spaced apart from the substrate and configured to generate a displacement in the cavity in response to an applied acoustic pressure;
- a back plate disposed over the diaphragm and in the vibration area, the back plate being spaced apart from the diaphragm to form an air gap between the diaphragm and the back plate; and
- a plurality of anchors disposed in the supporting area, the anchors extending from an end portion of the diaphragm toward the substrate, the plurality of anchors being arranged along a circumference of the diaphragm and spaced apart from one another along the circumference of the diaphragm to support the diaphragm from the substrate, each of the anchors extending along the circumference of the diaphragm presenting a serpentine shape in a plan view.

11. The MEMS microphone of claim 10, wherein the anchors adjacent to each other define at least slit to provide a passage through which the acoustic pressure moves.

12. The MEMS microphone of claim 11, wherein the slit is arranged one of a plurality of slits of the MEMS microphone, and a total area of the plurality of slits is proportional to the number of the plurality of slits.

13. The MEMS microphone of claim 11, wherein the slit has a length smaller than each of the anchors.

14. The MEMS microphone of claim 11, wherein each of the anchors has an area larger than that of the slit.

15. The MEMS microphone of claim 10, wherein the anchors are spaced apart from each other to surround the cavity.

16. The MEMS microphone of claim 10, further comprising:
- an upper insulation layer covering the back plate and holding the back plate to space the back plate from the diaphragm such that the air gap is maintained; and
- a chamber being disposed in the supporting area and extending from an end portion of the upper insulation layer toward the substrate to support the upper insulation layer, the chamber spacing the upper insulation layer from the diaphragm.

* * * * *